United States Patent
Yang et al.

(10) Patent No.: US 9,559,637 B2
(45) Date of Patent: Jan. 31, 2017

(54) MULTI-MODE BIAS MODULATOR AND ENVELOPE TRACKING POWER AMPLIFIER USING THE SAME

(71) Applicant: RESEARCH & BUSINESS FOUNDATION SUNGKYUNKWAN UNIVERSITY, Suwon-si (KR)

(72) Inventors: Youngoo Yang, Hwaseong-si (KR); Junghyun Ham, Suwon-si (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 14/621,734

(22) Filed: Feb. 13, 2015

(65) Prior Publication Data

US 2015/0236651 A1   Aug. 20, 2015

(30) Foreign Application Priority Data

Feb. 14, 2014   (KR) .................. 10-2014-0017156

(51) Int. Cl.
  *H03G 3/20*   (2006.01)
  *H03F 1/02*   (2006.01)
  (Continued)

(52) U.S. Cl.
  CPC .......... *H03F 1/0205* (2013.01); *H03F 1/0266* (2013.01); *H03F 1/0277* (2013.01); *H03F 3/19* (2013.01); *H03F 3/211* (2013.01); *H03F 3/217* (2013.01); *H03F 3/2171* (2013.01); *H03F 3/2173* (2013.01); *H03F 3/24* (2013.01);
  (Continued)

(58) Field of Classification Search
  CPC .... H03F 1/0205; H03F 3/2173; H03F 1/0266; H03F 1/0277; H03F 3/24; H03F 3/3028; H03F 3/72; H03F 3/19; H03F 3/211; H03F 3/217; H03F 3/2171; H03F 2203/21127; H03F 2200/432; H03F 2203/7215
  (Continued)

(56) References Cited

U.S. PATENT DOCUMENTS

| | | | | |
|---|---|---|---|---|
| 7,808,323 | B2 * | 10/2010 | Takinami | ................ G05F 1/565 330/296 |
| 8,237,499 | B2 * | 8/2012 | Chen | .................... H03F 1/0266 330/136 |

(Continued)

OTHER PUBLICATIONS

Kang, Daehyun, et al. "A Multimode/Multiband Power Amplifier With a Boosted Supply Modulator." Microwave Theory and Techniques, IEEE Transactions on 58.10 (2010): 2598-2608, Gainesville, FL, USA.

*Primary Examiner* — Khanh V Nguyen
(74) *Attorney, Agent, or Firm* — NSIP Law

(57) ABSTRACT

An envelope tracking power amplifier is disclosed herein. The envelope tracking power amplifier includes a multi-mode bias modulator and a power amplifier. The multi-mode bias modulator generates an envelope-modulated bias voltage from the envelope signal of an radio frequency (RF) signal whose power is to be amplified by using a linear amplifier and a switching amplifier each having varying current driving capability in response to an operation mode control signal that determines any one of low-level mode and high-level mode. The power amplifier is biased in response to the envelope-modulated bias voltage, amplifies the RF signal, and outputs the amplified RF signal to an antenna.

13 Claims, 4 Drawing Sheets

(51) Int. Cl.
*H03F 3/19* (2006.01)
*H03F 3/21* (2006.01)
*H03F 3/217* (2006.01)
*H03F 3/24* (2006.01)
*H03F 3/30* (2006.01)
*H03F 3/72* (2006.01)

(52) U.S. Cl.
CPC ............ *H03F 3/3028* (2013.01); *H03F 3/72* (2013.01); *H03F 2200/102* (2013.01); *H03F 2200/432* (2013.01); *H03F 2200/451* (2013.01); *H03F 2203/21127* (2013.01); *H03F 2203/7215* (2013.01); *H03F 2203/7236* (2013.01); *H03G 3/20* (2013.01)

(58) Field of Classification Search
USPC ....................................... 330/127, 136, 297
See application file for complete search history.

(56) References Cited

U.S. PATENT DOCUMENTS

| | | | |
|---|---|---|---|
| 8,508,297 B2* | 8/2013 | Honda .................. | H03F 1/0222 330/127 |
| 8,633,768 B2* | 1/2014 | Takahashi ............. | H03F 1/0222 330/10 |
| 8,698,558 B2* | 4/2014 | Mathe .................. | H03F 1/0227 330/136 |
| 8,766,716 B2* | 7/2014 | Paek ..................... | H03F 3/2178 330/10 |
| 8,975,960 B2* | 3/2015 | Strange ................ | H03F 1/0222 330/127 |
| 2012/0229213 A1* | 9/2012 | Takahashi ............. | H03F 3/2173 330/297 |
| 2013/0194037 A1* | 8/2013 | Takahashi ................ | H03F 1/32 330/127 |

* cited by examiner

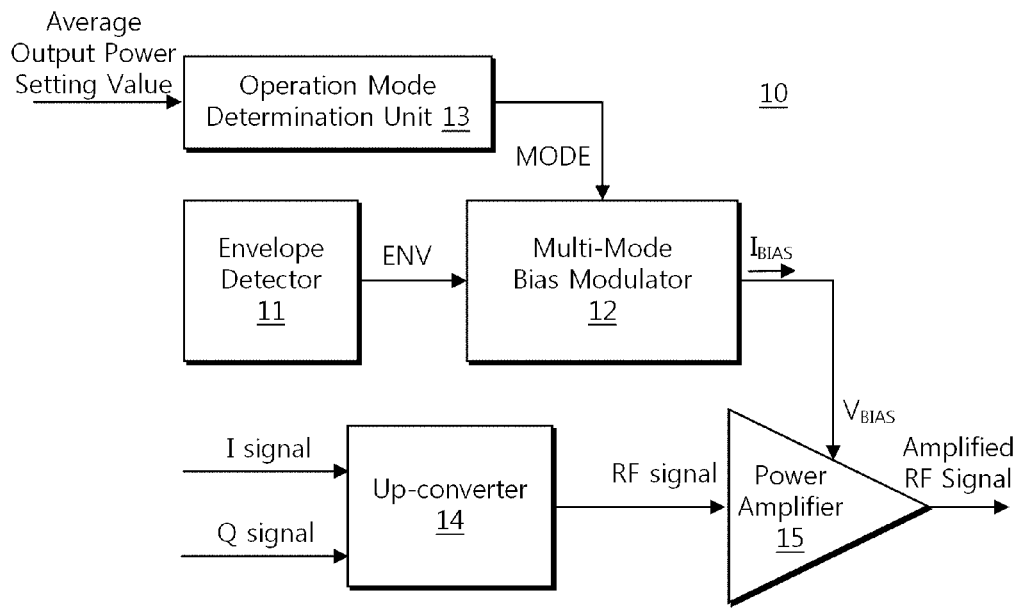
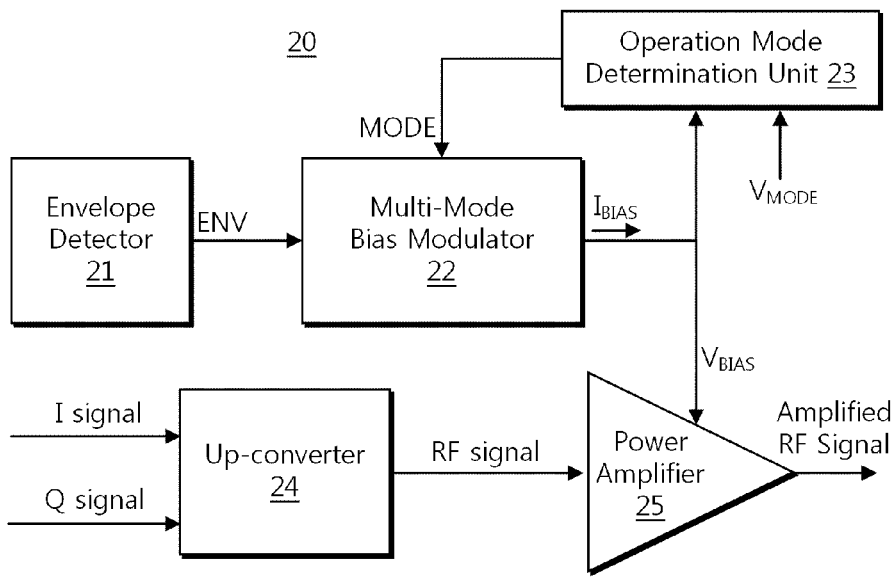

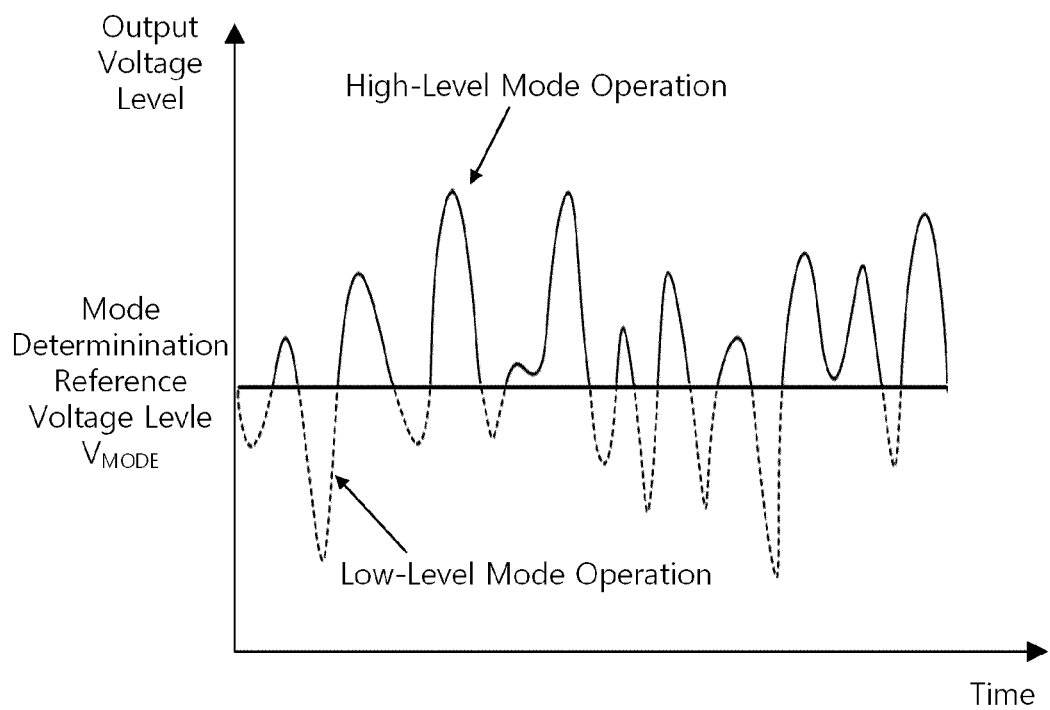

MULTI-MODE BIAS MODULATOR AND ENVELOPE TRACKING POWER AMPLIFIER USING THE SAME

CROSS-REFERENCE TO RELATED APPLICATION

This application claims the benefit under 35 U.S.C. §119 (a) of Korean Patent Application No. 10-2014-0017156, filed on Feb. 14, 2014, in the Korean Intellectual Property Office, the entire disclosures of which are incorporated herein by reference for all purposes.

BACKGROUND

1. Technical Field

The present invention relates generally to a power amplifier, and, more particularly, to an envelope tracking power amplifier

2. Description of the Related Art

Recent wireless communication systems utilize a modulation method having a high peak to average power ratio (PAPR), such as orthogonal frequency division multiplexing (OFDM), in order to process a large amount of data while efficiently utilizing limited frequency resources.

In a modulation method having a high PAPR, a high-efficiency power amplifier, such as a class C, D, E or F power amplifier, may be used as a power amplifier (PA) in order to maximize efficiency. Although these power amplifiers can operate with high efficiency in a compression region, i.e., in a saturation region, they require an additional linearization technique due to the non-linearity of the compression region and do not significantly improve efficiency in terms of an overall system.

Furthermore, these power amplifiers operate with high efficiency in the saturation region, but have poor efficiency in a back-off region lower than a maximum power point. Wireless communication systems operate in the back-off region lower than the PAPR during most of their operating time, thus resulting in poor efficiency in average power.

In order to solve these problems, there have been proposed an envelope tracking (ET) power amplification method of applying a bias, having a voltage level modulated in response to the envelope of an RF input signal, and the RF input signal to a linear mode power amplifier, rather than applying a fixed bias to the linear mode power amplifier, and an envelope elimination and restoration (EER) power amplification method of applying an input signal, including only a phase component left by removing an envelope using a bias, modulated according to the envelope, and a limiter, to a switching mode power amplifier.

Although the ET power amplification method has slightly lower efficiency than the EER power amplification method, it is advantageous in that a reduction in linearity is smaller despite timing mismatch that is inevitable between the RF input signal path of the power amplifier and the path of a modulated bias path and also in that the structure of the bias modulator is simpler.

Moreover, through the combination of the EER power amplification method and the ET power amplification method, there has been proposed hybrid ET power amplification method of applying a bias, having a voltage level modulated in response to an envelope, and an RF input signal to a switching mode power amplifier.

In the hybrid ET power amplification method, a bias modulator can achieve a high-speed operation and high efficiency using a linear amplifier providing a wide bandwidth and a switching amplifier having high efficiency in order to generate a modulated bias voltage based on a detected envelope.

In general, the overall efficiency of the bias modulator is determined based on bias voltage, output to the power amplifier, and load resistance because it increases or decreases in proportion to output power. In other words, when an output bias voltage modulated by the bias modulator is low because the size of an envelope is small, the power efficiency of the bias modulator is also low.

In order to overcome this problem, a DC-DC converter is added. When an output bias voltage is low, an operating voltage for the linear amplifier is lowered using the DC-DC converter, thereby being able to improve the efficiency of the bias modulator. However, this method is problematic in that the linear amplifier should be designed to operate desirably at all different operating voltages and both a circuit size and power consumption are increased due to the added DC-DC converter.

As a result, there is a need for a method for improving the efficiency of a bias modulator in a wide power region without additionally using analog circuits that require a relatively large area.

SUMMARY

At least some embodiments of the present invention are directed to the provision of a multi-mode bias modulator and an envelope tracking power amplifier using the same.

At least some embodiments of the present invention are directed to the provision of a multi-mode bias modulator capable of improving efficiency in a wide power region and an envelope tracking power amplifier using the same.

At least some embodiments of the present invention are directed to the provision of a multi-mode bias modulator capable of improving efficiency even at lower output power while minimizing the complexity of a circuit and an envelope tracking power amplifier using the same.

In accordance with an aspect of the present invention, there is provided an envelope tracking power amplifier, including a multi-mode bias modulator configured to generate an envelope-modulated bias voltage from an envelope signal of an radio frequency (RF) signal whose power is to be amplified by using a linear amplifier and a switching amplifier each having varying current driving capability in response to an operation mode control signal that determines any one of low-level mode and high-level mode; and a power amplifier configured to be biased in response to the envelope-modulated bias voltage, amplify the RF signal, and output the amplified RF signal to an antenna.

The operation mode control signal may be determined based on an average output power setting value, and the operation mode control signal may be determined to be the low-level mode when the average output power setting value is relatively low and to be the high-level mode when the average output power setting value is relatively high.

The linear amplifier and switching amplifier of the multi-mode bias modulator may selectively operate as any one of a device having relatively low current driving capability and a device having relatively high current driving capability in response to the operation mode control signal; the linear amplifier and the switching amplifier may operate as the device having relatively low current driving capability when operation mode based on the operation mode control signal is the low-level mode; and the linear amplifier and the switching amplifier may operate as the device having relatively high current driving capability when operation mode based on the operation mode control signal is the high-level mode.

The linear amplifier of the multi-mode bias modulator may include an operation amplifier configured to amplify an input envelope signal based on a specific gain value and output a differential output signal pair in a complementary form, and at least two first and second class AB buffers each configured to comprise a push device and a pull device driven by the differential output signal pair and drive a linear amplification bias current at a connection terminal for the push device and the pull device, the first and second class AB buffers may have different channel widths so that the first and second class AB buffers have different current driving capabilities; and only one of the first and second class AB buffers may operate to drive the linear amplification bias current in response to the operation mode control signal.

The linear amplifier of the multi-mode bias modulator may further include first and second demultiplexers that are inserted between the differential output signal pair of the operation amplifier and the push devices and pull devices of the first and second class AB buffers and that operate to connect the differential output signal pair of the operation amplifier to control terminals of the push device and pull device of the first class AB buffer or control terminals of the push device and pull device of the second class AB buffer in response to the operation mode control signal.

The switching amplifier of the multi-mode bias modulator may include first and second switching amplification stages that each comprise a pull-up device and a pull-down device connected in series between a power line and a ground line and that each drive a switching amplification bias current at a connection terminal for the pull-up device and the pull-down device; the first and second switching amplification stages may have different channel widths so that the first and second switching amplification stages have different current driving capabilities; and only any one of the first and second switching amplification stages may operate to drive the switching amplification bias current in response to the operation mode control signal.

The switching amplifier of the multi-mode bias modulator may further include third and fourth demultiplexers that operate to selectively drive the pull-up and pull-down devices of the first switching amplification stage and the pull-up and pull-down devices of the second switching amplification stage in response to the operation mode control signal.

The linear amplifier of the multi-mode bias modulator may include an operation amplifier configured to amplify an input envelope signal based on a specific gain value and output a differential output signal pair in a complementary form, and at least two first and second class AB buffers each configured to comprise push and pull devices driven by the differential output signal pair and drive a linear amplification bias current at a connection terminal for the push device and the pull device; and only the first class AB buffer or both the first and second class AB buffers may drive the linear amplification bias current in response to the operation mode control signal.

The linear amplifier of the multi-mode bias modulator may further include first and second switches that are inserted between the differential output signal pair of the operation amplifier and the push and pull devices of the first and second class AB buffers and that operate to connect the differential output signal pair of the operation amplifier to control terminals of the push and pull devices of the first class AB buffer or control terminals of the push and pull devices of the second class AB buffer in response to the operation mode control signal.

The switching amplifier of the multi-mode bias modulator may include first and second switching amplification stages that each comprise pull-up and pull-down devices connected in series between a power line and a ground line and that each drive a switching amplification bias current at a connection terminal for the pull-up device and the pull-down device; and only the first switching amplification stage or both the first and second switching amplification stages may drive the switching amplification bias current in response to the operation mode control signal.

The switching amplifier of the multi-mode bias modulator may further include third and fourth switches that operate to drive the pull-up and pull-down devices of the first switching amplification stage or the pull-up and pull-down devices of the first and second switching amplification stages in response to the operation mode control signal.

The envelope tracking power amplifier may further include an operation mode determination unit configured to detect a level of the envelope-modulated bias voltage output by the multi-mode bias modulator, determine any one of the low-level mode and the high-level mode based on a result of comparison between the detected level of the envelope-modulated bias voltage and a specific mode determination reference voltage, and generate the operation mode control signal.

The operation mode determination unit may detect the level of the envelope-modulated bias voltage output by the multi-mode bias modulator, may determine any one of the low-level mode and the high-level mode based on the results of the comparison between the detected level of the envelope-modulated bias voltage and a specific mode determination reference hysteresis range, and may generate the operation mode control signal.

BRIEF DESCRIPTION OF THE DRAWINGS

The above and other objects, features and advantages of the present invention will be more clearly understood from the following detailed description taken in conjunction with the accompanying drawings, in which:

FIG. 1 is a block diagram of an envelope tracking power amplifier according to an embodiment of the present invention;

FIG. 2 is a block diagram of an envelope tracking power amplifier according to another embodiment of the present invention;

FIG. 7 is a conceptual diagram of an operation of frequently changing mode with respect to an exemplary envelope waveform in the multi-mode bias modulator used in the envelope tracking power amplifier according to another embodiment of the present invention.

DETAILED DESCRIPTION

Figure 3:
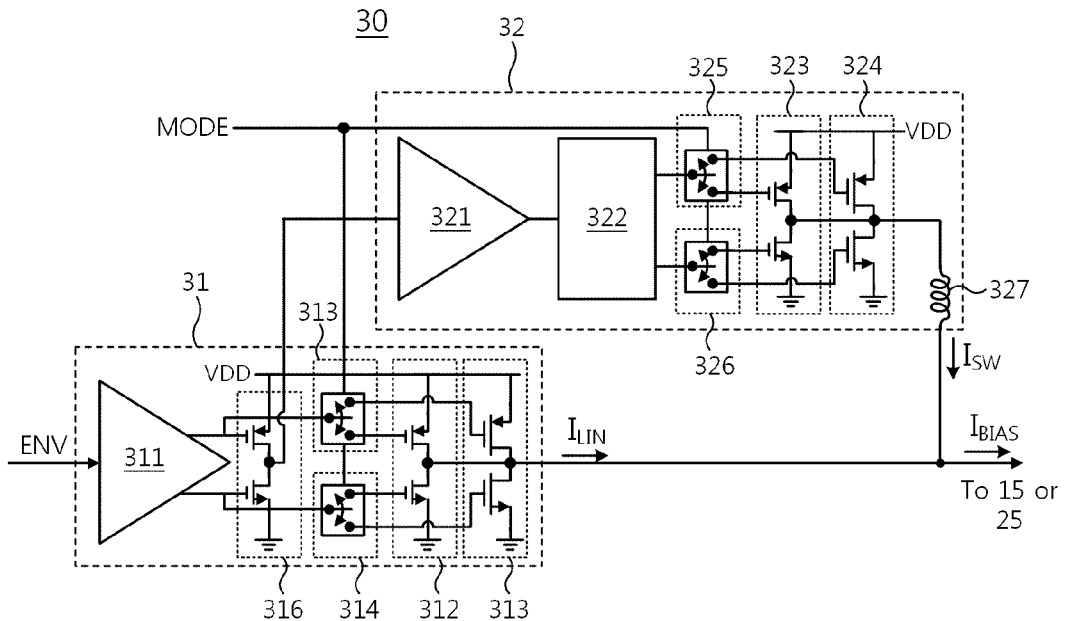
FIG. 3 is a circuit diagram of a multi-mode bias modulator used in the envelope tracking power amplifier according to an embodiment of the present invention.

With regard to embodiments of the present invention disclosed herein, specific structural and functional descriptions are given merely for the purpose of illustrating the embodiments of the present invention. Embodiments of the present invention may be practiced in various forms, and the present invention should not be construed as being limited to embodiments disclosed herein.

Embodiments of the present invention will be described in detail below with reference to the accompanying drawings. The same reference numerals will be used to denote the same components throughout the accompanying drawings, and redundant descriptions of the same components will be omitted.

FIG. 1 is a block diagram of an envelope tracking power amplifier according to an embodiment of the present invention.

Referring to FIG. 1, the envelope tracking power amplifier 10 may include an envelope detector 11, a multi-mode bias modulator 12, an operation mode determination unit 13, an up-converter 14, and a power amplifier 15.

The envelope detector 11 may detect an envelope signal ENV from a baseband signal, or from an up-converted RF signal in some embodiments. When the envelope detector 11 is implemented in an analog fashion, it may simply include a rectifier diode and a low-pass filter that are connected in series. A baseband signal or an RF signal may be applied to the rectifier diode, and an envelope signal ENV may be output at both terminals of the low-pass filter. When the envelope detector 11 is implemented in a digital fashion, it may generate an envelope signal ENV by interpolating the peak values of baseband signal samples.

The multi-mode bias modulator 12 includes a linear amplifier and a switching amplifier each having current driving capability varying in response to an operation mode control signal MODE, and outputs an envelope-modulated bias voltage $V_{BIAS}$. Although will be described in detail later, the multi-mode bias modulator 12 drives a linear amplification bias current corresponding to the AC component of the envelope signal ENV via the linear amplifier, drives a switching amplification bias current corresponding to the DC component of the envelope signal ENV via the switching amplifier, combines the linear amplification bias current and the switching amplification bias current, and supplies an envelope-modulated bias current $I_{BIAS}$ for the power amplifier 15. Most of the envelope-modulated bias current $I_{BIAS}$ substantially corresponds to the switching amplification bias current.

The envelope-modulated bias voltage $V_{BIAS}$ for the power amplifier 15 is represented by the output resistance of the multi-mode bias modulator 12 and the input resistance and envelope-modulated bias current $I_{BIAS}$ of the power amplifier 15.

The operation mode determination unit 13 determines any one of operation modes, including low-level mode and high-level mode, depending on the magnitude of average output power that is set such that the envelope tracking power amplifier 10 outputs the average output power, and outputs an operation mode control signal MODE.

For example, the operation mode determination unit 13 may output the operation mode control signal MODE so that the multi-mode bias modulator 12 operates in low-level mode if the magnitude of externally set average output power is 20 dBm or lower and the multi-mode bias modulator 12 operates in high-level mode if the magnitude of externally set average output power is higher than 20 dBm.

The linear amplifier and switching amplifier of the multi-mode bias modulator 12 may selectively operate as a device having relatively low current driving capability and as a device having relatively high current driving capability in response to the operation mode control signal MODE.

More specifically, when the operation mode based on the operation mode control signal MODE is low-level mode, the linear amplifier and switching amplifier of the multi-mode bias modulator 12 may operate as a device having relatively low current driving capability. When the output bias voltage $V_{BIAS}$ is relatively low, the linear amplifier and switching amplifier of the multi-mode bias modulator 12 that operate as a device having relatively low current driving capability exhibit higher power efficiency than a device having relatively high current driving capability.

In contrast, when the operation mode based on the operation mode control signal MODE is high-level mode, the linear amplifier and switching amplifier of the multi-mode bias modulator 12 may operate as a device having relatively high current driving capability. When the output bias voltage $V_{BIAS}$ is relatively high, the linear amplifier and switching amplifier of the multi-mode bias modulator 12 that operate as a device having relatively high current driving capability exhibit higher power efficiency than a device having relatively low current driving capability.

Accordingly, the multi-mode bias modulator 12 can exhibit excellent power efficiency regardless of whether the output envelope-modulated bias voltage $V_{BIAS}$ is high or low.

The up-modulator 14 generates an RF signal by up-modulating the I and Q components of a baseband signal using a specific appropriate modulation method.

The power amplifier 15 may receive the RF signal up-modulated by the up-modulator 14, may amplify the up-modulated RF signal based on the envelope-modulated bias voltage $V_{BIAS}$ of the multi-mode bias modulator 12, and may output the amplified RF signal to an antenna (not illustrated).

FIG. 2 is a block diagram of an envelope tracking power amplifier according to another embodiment of the present invention.

Referring to FIG. 2, the envelope tracking power amplifier 20 may include an envelope detector 21, a multi-mode bias modulator 22, an operation mode determination unit 23, an up-converter 24, and a power amplifier 25.

Since the envelope detector 21, multi-mode bias modulator 22, up-converter 24, and power amplifier 25 of the envelope tracking power amplifier 20 of FIG. 2 are substantially the same as or similar to the envelope detector 11, multi-mode bias modulator 12, up-converter 14, and power amplifier 15 of the envelope tracking power amplifier 10 of FIG. 1, descriptions thereof are omitted for the sake of convenience.

The operation mode determination unit 23 detects the level of the envelope-modulated bias voltage $V_{BIAS}$ output by the multi-mode bias modulator 22, determines any one of operation modes, including low-level mode and high-level mode based on the results of the comparison between the detected level of the detected envelope-modulated bias voltage $V_{BIAS}$ and the level of a specific mode determination reference voltage $V_{MODE}$, and outputs the operation mode control signal MODE.

In some embodiments, the operation mode determination unit 23 may detect the level of the envelope-modulated bias voltage $V_{BIAS}$ output by the multi-mode bias modulator 22, may determine any one of operation modes, including low-level mode and high-level mode, based on the results of the comparison between the detected level of the envelope-modulated bias voltage $V_{BIAS}$ and a specific mode determination reference hysteresis range, and may output the operation mode control signal MODE.

FIG. 3 is a circuit diagram of the multi-mode bias modulator used in the envelope tracking power amplifier according to an embodiment of the present invention.

The power of the envelope signal ENV is chiefly present in a DC component or a low frequency band, and the remaining power is present in an AC component or a high frequency band. For this reason, in general, in the envelope tracking power amplifier, the switching amplifier operating in a low frequency band with high efficiency may be configured to amplify the DC component of the envelope signal ENV, and the linear amplifier 31 having a wide operating frequency band may be configured to amplify the AC component of the envelope signal ENV.

Accordingly, the multi-mode bias modulator 30 of FIG. 3 may include a linear amplifier 31 configured to drive a linear amplification bias current $I_{LIN}$ in response to the AC component of the envelope signal ENV, and a switching amplifier 32 configured to drive a switching amplification bias current $I_{SW}$ corresponding to the DC component of the envelope signal ENV. The multi-mode bias modulator 30 may generate the envelope-modulated bias current $I_{BIAS}$ by combining the linear amplification bias current $I_{LIN}$ driven by the linear amplifier 31 and the switching amplification bias current $I_{SW}$ driven by the switching amplifier 32.

For this purpose, the linear amplifier 31 may include, for example, an operation amplifier 311, first and second class AB buffers 312 and 313, first and second demultiplexers 314 and 315, and a detection unit 316.

More specifically, first, the envelope signal ENV is applied to the operation amplifier 311 of the linear amplifier 31. In general, the operation amplifier 311 may operate using high input resistance, low output resistance, a very high open-loop gain value and a wide bandwidth, and may guarantee linearity in the AC component of the envelope signal. Furthermore, the operation amplifier 311 may be designed in a rail-to-rail manner, and thus may maximize the voltage range of the differential output signal of the operation amplifier 311 within a power source voltage range.

The operation amplifier 311 is set, for example, such that it has a specific gain value determined by input-side resistance and feedback resistance, amplifies the input envelope signal ENV based on the specific gain value, and outputs a differential output signal pair in a complementary form.

The differential output signal pair output by the operation amplifier 311 is input to the control terminals of the push and pull devices of each of the at least two first and second class AB buffers 312 and 313. In this case, the push device may be a p-channel metal oxide semiconductor (PMOS) device, and the pull device may be an n-channel MOS (NMOS) device.

In particular, each of the first and second class AB buffers 312 and 313 may include a PMOS push device and an NMOS pull device connected in series between a power source voltage (VDD) line and a ground line so that a rail-to-rail operation can be performed, and may drive the linear amplification bias current $I_{LIN}$ at a connection terminal for the PMOS push device and the NMOS pull device.

In this case, the first and second class AB buffers 312 and 313 have different channel widths so that they have different current driving capabilities. Only any one of the first and second class AB buffers 312 and 313 may drive the linear amplification bias current $I_{LIN}$ in response to the operation mode control signal MODE.

More specifically, when the operation mode based on the operation mode control signal MODE is low-level mode, only a class AB buffer that belongs to the first and second class AB buffers 312 and 313 of the linear amplifier 31 and that has relatively low current driving capability may be driven by the differential output signal pair of the operation amplifier 211, thereby being able to drive the linear amplification bias current $I_{LIN}$.

In contrast, when the operation mode based on the operation mode control signal MODE is high-level mode, only a class AB buffer that belongs to the first and second class AB buffers 312 and 313 of the linear amplifier 31 and that has relatively high current driving capability may be driven by the differential output signal pair of the operation amplifier 311, thereby being able to drive the linear amplification bias current $I_{LIN}$.

For this purpose, the first and second demultiplexers 314 and 315 may be inserted between the differential output signal pair of the operation amplifier 311 and the first and second class AB buffers 312 and 313, and may connect the differential output signal pair of the operation amplifier 311 to the gate terminals of the PMOS push device and NMOS pull device of the first class AB buffer 312 or the gate terminals of the PMOS push device and NMOS pull device of the second class AB buffer 313 in response to the operation mode control signal MODE.

For the switching amplification of the DC component of the envelope signal ENV, the output voltage of the class AB buffer based on the differential output signal pair of the operation amplifier 311 of the linear amplifier 31 is detected by the detection unit 316, and is transferred to the switching amplifier 32 as a switching input signal.

Like the first and second class AB buffers 312 and 313, the detection unit 316 may have a rail-to-rail class AB buffer structure, that is, a PMOS push device and an NMOS pull device connected in series between the power source voltage (VDD) line and the ground line, and may output the voltage of a connection terminal for the PMOS push device and the NMOS pull device as the switching input signal.

Furthermore, the switching amplifier 32 may include, for example, a comparator 321, a shooting current prevention and driving circuit unit 322, first and second switching amplification stages 323 and 324, third and fourth demultiplexers 325 and 326, and an inductor 327.

The comparator 321 compares the switching input signal, output by the detection unit 316 connected to the linear amplifier 31, with a specific reference voltage, and outputs a comparison signal that is activated when the voltage level of the switching input signal is higher than the specific reference voltage. If the DC component of the envelope signal ENV increases, the time it takes for the switching input signal to become higher than the reference voltage increases, and thus the duty ratio of the comparison signal also increases. The first and second switching amplification stages 323 and 324 are driven in response to the duty ratio of the comparison signal, and thus the switching amplification bias current $I_{SW}$ is driven.

The shooting current prevention and driving circuit unit 322 may generate a driving voltage pair that will drive the pull-up device and pull-down device of the first or second switching amplification stage 323 or 324 in response to the comparison signal of the comparator 321. In this case, the shooting current prevention and driving circuit unit 322 may generate the driving voltage pair for the first or second switching amplification stage 323 or 324 in order to prevent the phenomenon in which the pull-up and pull-down devices of the first and second switching amplification stages 323 and 324 that are connected in series are simultaneously turned on and, thus, an electric current is directly shoot from the power source voltage (VDD) to the ground line.

The driving voltage pair output by the shooting current prevention and driving circuit unit 322 is input to the control terminals of the pull-up and pull-down devices of each of the at least two first and second switching amplification stages 323 and 324. In this case, the pull-up device may be a PMOS device, and the pull-down device may be an NMOS device.

Each of the first and second switching amplification stages 323 and 324 may include a PMOS pull-up device and an NMOS pull-down device connected in series between the power source voltage (VDD) line and the ground line so that the rail-to-rail operation can be performed, and may drive the switching amplification bias current $I_{SW}$ at a connection terminal for the PMOS pull-up device and the NMOS pull-down device.

In this case, the first and second switching amplification stages 323 and 324 have different channel widths so that they have different current driving capabilities. Only any one of the first and second switching amplification stages 323 and 324 may drive the switching amplification bias current $I_{SW}$ in response to the operation mode control signal MODE.

More specifically, when the operation mode based on the operation mode control signal MODE is low-level mode, only a switching amplification stage that belongs to the first and second switching amplification stages 323, 324 of the switching amplifier 32 and that has relatively low current driving capability may be driven by the driving voltage pair of the shooting current prevention and driving circuit unit 322, thereby being able to drive the switching amplification bias current $I_{SW}$.

In contrast, when the operation mode based on the operation mode control signal MODE is high-level mode, only a switching amplification stage that belongs to the first and second switching amplification stages 323, 324 of the switching amplifier 32 and that has relatively high current driving capability may be driven by the driving voltage pair of the shooting current prevention and driving circuit unit 322, thereby being able to drive the switching amplification bias current $I_{SW}$.

For this purpose, the third and fourth demultiplexers 325 and 326 may be inserted between the driving voltage pair of the shooting current prevention and driving circuit unit 322 and the first and second switching amplification stages 323 and 324 of the switching amplifier 32, and may selectively connect the driving voltage pair of the shooting current prevention and driving circuit unit 322 to the gate terminals of the PMOS pull-up device and NMOS pull-down device of the first switching amplification stage 323 or the gate terminals of the PMOS pull-up device and NMOS pull-down device of the second switching amplification stage 324 in response to the operation mode control signal MODE.

In other words, the third and fourth demultiplexers 325 and 326 may selectively drive the pull-up device and pull-down device of the first switching amplification stage 323 or the pull-up device and pull-down device of the second switching amplification stage 324 in response to the operation mode control signal MODE.

The inductor 327 acts as a type of low-pass filter that smoothes the switching amplification bias current $I_{SW}$ that is responsible for the DC component of the envelope-modulated bias current $I_{BIAS}$.

Accordingly, the multi-mode bias modulator 30 can exhibit excellent power efficiency regardless of whether the output envelope-modulated bias voltage $V_{BIAS}$ is high or low.

Figure 4:
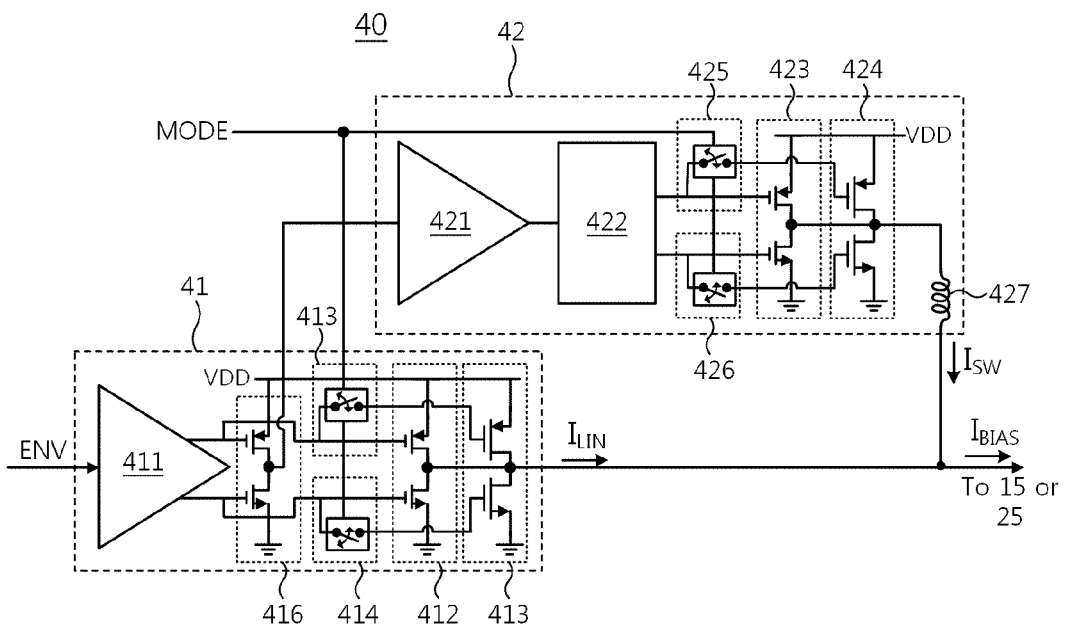
FIG. 4 is a circuit diagram of a multi-mode bias modulator used in the envelope tracking power amplifier according to another embodiment of the present invention.

FIG. 4 is a circuit diagram of the multi-mode bias modulator used in the envelope tracking power amplifier according to another embodiment of the present invention.

The multi-mode bias modulator 40 of FIG. 4 is generally similar to the multi-mode bias modulator 30 of FIG. 3, but is different from the multi-mode bias modulator 30 of FIG. 3 in that first to fourth switches 414, 415, 425 and 426 are used instead of the first to the fourth demultiplexers 314, 315, 325 and 326 of the multi-mode bias modulator 30 of FIG. 3 and also in that the first and second class AB buffers 312 and 313 and first and the second switching amplification stages 323 and 324 of FIG. 3 have different current driving capabilities while the first and second class AB buffers 412 and 413 and first and second switching amplification stages 423 and 424 of FIG. 4 may have the same current driving capability or different current driving capabilities.

The multi-mode bias modulator 40 of FIG. 4 may include a linear amplifier 41 configured to drive the linear amplification bias current $I_{LIN}$ in response to the AC component of the envelope signal ENV, and a switching amplifier 42 configured to drive the switching amplification bias current $I_{SW}$ corresponding to the DC component of the envelope signal ENV. The multi-mode bias modulator 40 may generate the envelope-modulated bias current $I_{BIAS}$ by combining the linear amplification bias current $I_{LIN}$ and the switching amplification bias current $I_{SW}$.

The linear amplifier 41 of the multi-mode bias modulator 40 of FIG. 4 may include an operation amplifier 411, at least two first and second class AB buffers 412 and 413, at least two first and second switches 414 and 415, and a detection unit 416. Since the operation amplifier 411 and the detection unit 416 are substantially the same as the operation amplifier 311 and detection unit 316 of the linear amplifier 31 of the multi-mode bias modulator 30 of FIG. 3, descriptions thereof are omitted.

In this case, the first and second class AB buffers 412, 413 may have the same channel width or different channel widths so that they have the same current driving capability or different current driving capabilities. Only the first class AB buffer 412 or both the first and second class AB buffers 412 and 413 may drive the linear amplification bias current $I_{LIN}$ in response to the operation mode control signal MODE.

More specifically, when the operation mode based on the operation mode control signal MODE is low-level mode, only the first class AB buffer 412 of the linear amplifier 41 may operate as a device having relatively low current driving capability in response to the differential output signal pair of the operation amplifier 411, thereby driving the linear amplification bias current $I_{LIN}$.

In contrast, when the operation mode based on the operation mode control signal MODE is high-level mode, both the first and second class AB buffers 412 and 413 of the linear amplifier 41 may operate as a device having relatively high current driving capability in response to the differential output signal pair of the operation amplifier 411, thereby driving the linear amplification bias current $I_{LIN}$.

For this purpose, the first and second switches 414 and 415 may be inserted between the differential output signal pair of the operation amplifier 411 and the second class AB buffer 413, and may selectively connect the differential output signal pair of the operation amplifier 411 to the gate terminals of the PMOS push device and NMOS pull device of the second class AB buffer 413 in response to the operation mode control signal MODE.

Furthermore, the switching amplifier 42 may include a comparator 421, a shooting current prevention and driving circuit unit 422, first and second switching amplification stages 423 and 424, third and fourth switches 425 and 426, and an inductor 427.

In this case, since the comparator 421, the shooting current prevention and driving circuit unit 422 and the inductor 427 are substantially the same as or similar to the comparator 321, shooting current prevention and driving circuit unit 322 and inductor 327 of the switching amplifier 32 of the multi-mode bias modulator 30 of FIG. 3, descriptions thereof are omitted.

In this case, the first and second switching amplification stages 423, 424 may have the same channel width or different channel widths so that they have the same current driving capability or different current driving capabilities. Only the first switching amplification stage 423 or both the first and second switching amplification stages 423 and 424 may drive the switching amplification bias current $I_{SW}$ in response to the operation mode control signal MODE.

More specifically, when the operation mode based on the operation mode control signal MODE is low-level mode, only the first switching amplification stage 423 of the switching amplifier 42 may operate as a device having relatively low current driving capability in response to the driving voltage pair of the shooting current prevention and driving circuit unit 422, thereby driving the switching amplification bias current $I_{SW}$.

In contrast, when the operation mode based on the operation mode control signal MODE is high-level mode, both the first and second switching amplification stages 423 and 424 of the switching amplifier 42 may operate as a device having relatively high current driving capability in response to the driving voltage pair of the shooting current prevention and driving circuit unit 422, thereby driving the switching amplification bias current $I_{SW}$.

For this purpose, the third and fourth switches 425 and 426 may be inserted between the driving voltage pair of the shooting current prevention and driving circuit unit 422 and the first and second switching amplification stages 423 and 424 of the switching amplifier 42, and may selectively connect the driving voltage pair of the shooting current prevention and driving circuit unit 422 to the gate terminals of the PMOS pull-up device and NMOS pull-down device of the second switching amplification stage 424 in response to the operation mode control signal MODE.

In other words, the third and fourth switches 425 and 426 may selectively drive the pull-up and pull-down devices of the first switching amplification stage 423 or the pull-up and pull-down devices of the first and second switching amplification stages 423 and 424 in response to the operation mode control signal MODE.

Accordingly, like the multi-mode bias modulator 30 of FIG. 3, the multi-mode bias modulator 40 of FIG. 4 can exhibit excellent power efficiency regardless of whether the output envelope-modulated bias voltage $V_{BIAS}$ is high or low.

Figure 5:
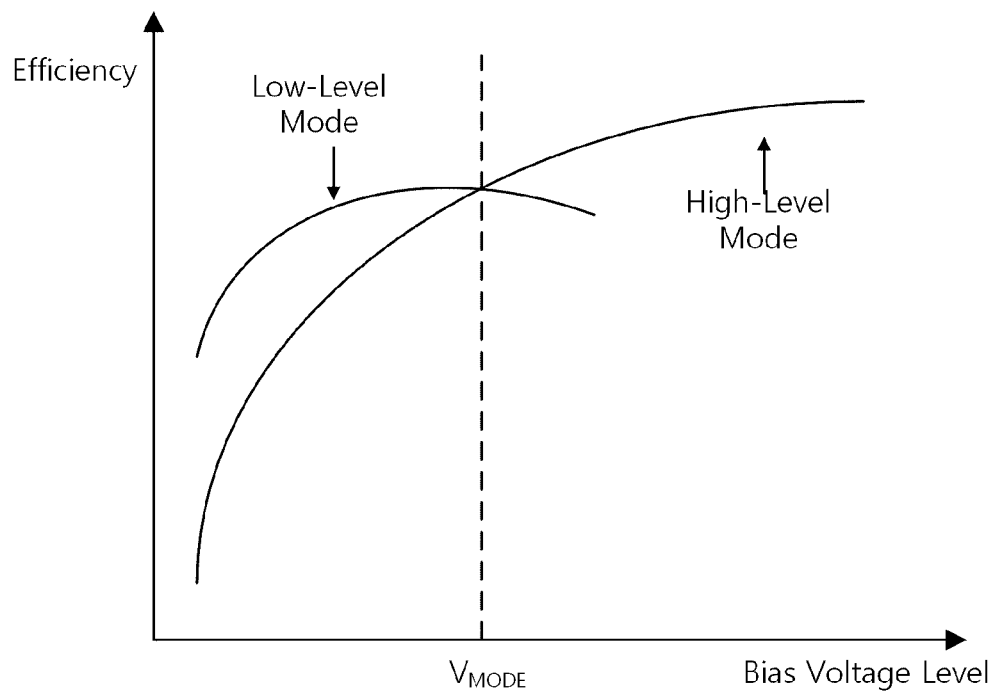
FIG. 5 is a conceptual diagram comparing power efficiency based on low-level mode with power efficiency based on high-level mode in the multi-mode bias modulators used in the envelope tracking power amplifiers according to embodiments of the present invention.

FIG. 5 is a conceptual diagram comparing power efficiency based on low-level mode with power efficiency based on high-level mode in the multi-mode bias modulators used in the envelope tracking power amplifiers according to embodiments of the present invention.

Referring to FIG. 5, in low-level mode, an increase in the output voltage of the bias modulator is limited, but efficiency in low-level mode is relatively high in a relatively low output voltage range and starts to decrease as the output voltage increases.

In contrast, in high-level mode, a range in which the output voltage of the bias modulator is generated is relatively wide, but efficiency in high-level mode is relatively low in a relatively low output voltage range and is high in a high output voltage range.

In an embodiment, the multi-mode bias modulator may operate in low-level mode in a power range lower than a specific average power value, and may operate in high-level mode in a power range higher than the specific average power value.

In another embodiment, assuming that an output voltage corresponding to a point at which the efficiency curves of two types of operation modes intersect each other is an operation mode determination reference voltage, the efficiency in low-level mode may be better in an output voltage range lower than the operation mode determination reference voltage, and the efficiency in high-level mode may be better in an output voltage range higher than the operation mode determination reference voltage.

Accordingly, the overall efficiency can be improved if operation mode is determined based on the operation mode determination reference voltage and also the current driving capabilities of the linear amplifier and the switch amplifier are controlled based on the determined operation mode, as illustrated in FIG. 2.

However, switching noise may occur due to the demultiplexer or the switch when the operation mode is switched. In some embodiments, in order to prevent switching from occurring excessively frequently, the operation mode is not strictly determined based on the operation mode determination reference voltage, but may be flexibly determined based on a hysteresis range including the operation mode determination reference voltage.

Figure 6:
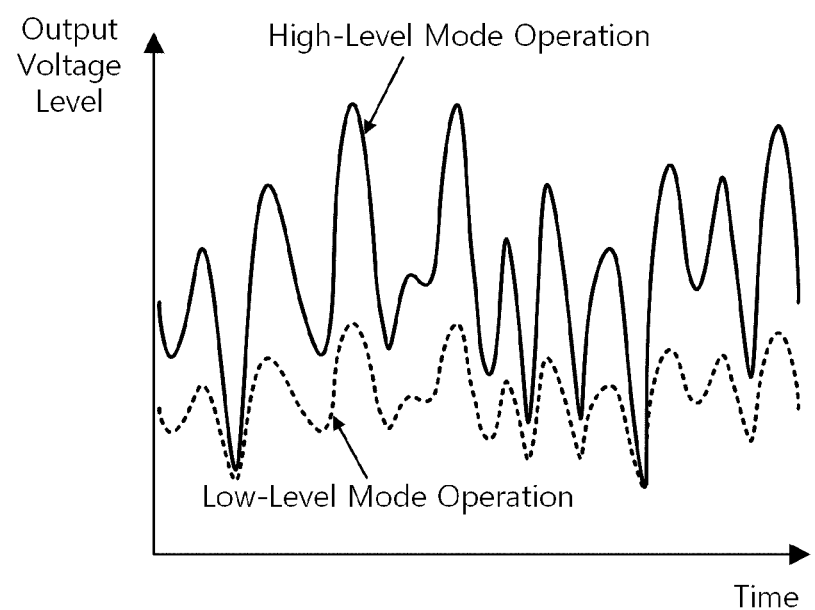
FIG. 6 is a conceptual diagram of an operation of changing mode with respect to an exemplary envelope waveform in the multi-mode bias modulator used in the envelope tracking power amplifier according to an embodiment of the present invention.

FIG. 6 is a conceptual diagram of an operation of changing mode based on average output power with respect to an exemplary envelope waveform in the multi-mode bias modulator used in the envelope tracking power amplifier according to an embodiment of the present invention.

Referring to FIG. 6, in the envelope tracking power amplifier 10 of FIG. 1, when a relatively high average output power setting value is set based on a specific average output power setting value, the multi-mode bias modulator 12 operates in high-level mode because a relatively high bias voltage is required. In contrast, when a relatively low average output power setting value is set, the multi-mode bias modulator 12 operates in low-level mode because a relatively low bias voltage is required. Accordingly, excellent power efficiency can be maintained regardless of whether the envelope tracking power amplifier 10 operates with low average output power or high average output power.

FIG. 7 is a conceptual diagram of an operation of changing mode based on a bias voltage with respect to an exemplary envelope waveform in the multi-mode bias modulator used in the envelope tracking power amplifier according to another embodiment of the present invention.

Referring to FIG. 7, in the envelope tracking power amplifier 20 of FIG. 2, when a bias voltage higher than a voltage level of the operation mode determination reference voltage $V_{MODE}$ is generated, the multi-mode bias modulator 22 operates in high-level mode. In contrast, when a bias voltage lower than the voltage level of the operation mode determination reference voltage $V_{MODE}$ is generated, the multi-mode bias modulator 22 operates in low-level mode.

Accordingly, high power efficiency can be maintained at both a low bias voltage and a high bias voltage.

In accordance with the multi-mode bias modulator and the envelope tracking power amplifier using the same according to the embodiments of the present invention, efficiency can be improved in a wide power region.

In accordance with the multi-mode bias modulator and the envelope tracking power amplifier using the same according to the embodiments of the present invention, the complexity of a circuit can be minimized and efficiency power can also be improved even at lower output.

The above embodiments and the accompanying drawings are intended merely to clearly illustrate part of the technical spirit of the present invention, and it will be apparent to those skilled in the art that modifications and specific embodiments that those skilled in the art can easily derive from the present specification and the accompanying drawings are all included in the range of the rights of the present invention.

What is claimed is:

1. An envelope tracking power amplifier, comprising:
   a multi-mode bias modulator configured to generate an envelope-modulated bias voltage from an envelope signal of a radio frequency (RF) signal whose power is to be amplified by using a linear amplifier and a switching amplifier each having varying current driving capability in response to an operation mode control signal that determines any one of low-level mode and high-level mode; and
   a power amplifier configured to be biased in response to the envelope-modulated bias voltage, amplify the RF signal, and output the amplified RF signal to an antenna.

2. The envelope tracking power amplifier of claim 1, wherein the operation mode control signal is determined based on an average output power setting value, and the operation mode control signal is determined to be the low-level mode when the average output power setting value is relatively low and to be the high-level mode when the average output power setting value is relatively high.

3. The envelope tracking power amplifier of claim 1, wherein:
   the linear amplifier and switching amplifier of the multi-mode bias modulator selectively operates as any one of a device having relatively low current driving capability and a device having relatively high current driving capability in response to the operation mode control signal;
   the linear amplifier and the switching amplifier operates as the device having relatively low current driving capability when operation mode based on the operation mode control signal is the low-level mode; and
   the linear amplifier and the switching amplifier operates as the device having relatively high current driving capability when operation mode based on the operation mode control signal is the high-level mode.

4. The envelope tracking power amplifier of claim 3, wherein the linear amplifier of the multi-mode bias modulator comprises:
   an operation amplifier configured to amplify an input envelope signal based on a specific gain value and output a differential output signal pair in a complementary form; and
   at least two first and second class AB buffers each configured to comprise a push device and a pull device driven by the differential output signal pair and drive a linear amplification bias current at a connection terminal for the push device and the pull device;
   wherein the first and second class AB buffers have different channel widths so that the first and second class AB buffers have different current driving capabilities, and only one of the first and second class AB buffers operates to drive the linear amplification bias current in response to the operation mode control signal.

5. The envelope tracking power amplifier of claim 4, wherein the linear amplifier of the multi-mode bias modulator further comprises first and second demultiplexers that are inserted between the differential output signal pair of the operation amplifier and the push devices and pull devices of the first and second class AB buffers and that operate to connect the differential output signal pair of the operation amplifier to control terminals of the push device and pull device of the first class AB buffer or control terminals of the push device and pull device of the second class AB buffer in response to the operation mode control signal.

6. The envelope tracking power amplifier of claim 3, wherein:
   the switching amplifier of the multi-mode bias modulator comprises first and second switching amplification stages that each comprise a pull-up device and a pull-down device connected in series between a power line and a ground line and that each drive a switching amplification bias current at a connection terminal for the pull-up device and the pull-down device;
   the first and second switching amplification stages have different channel widths so that the first and second switching amplification stages have different current driving capabilities; and
   only any one of the first and second switching amplification stages operates to drive the switching amplification bias current in response to the operation mode control signal.

7. The envelope tracking power amplifier of claim 6, wherein the switching amplifier of the multi-mode bias modulator further comprises third and fourth demultiplexers that operate to selectively drive the pull-up and pull-down devices of the first switching amplification stage and the pull-up and pull-down devices of the second switching amplification stage in response to the operation mode control signal.

8. The envelope tracking power amplifier of claim 3, wherein the linear amplifier of the multi-mode bias modulator comprises:
   an operation amplifier configured to amplify an input envelope signal based on a specific gain value and output a differential output signal pair in a complementary form; and
   at least two first and second class AB buffers each configured to comprise push and pull devices driven by the differential output signal pair and drive a linear amplification bias current at a connection terminal for the push device and the pull device;
   wherein only the first class AB buffer or both the first and second class AB buffers drive the linear amplification bias current in response to the operation mode control signal.

9. The envelope tracking power amplifier of claim 8, wherein the linear amplifier of the multi-mode bias modulator further comprises first and second switches that are inserted between the differential output signal pair of the operation amplifier and the push and pull devices of the first and second class AB buffers and that operate to connect the differential output signal pair of the operation amplifier to control terminals of the push and pull devices of the first class AB buffer or control terminals of the push and pull devices of the second class AB buffer in response to the operation mode control signal.

10. The envelope tracking power amplifier of claim 3, wherein:
the switching amplifier of the multi-mode bias modulator comprises first and second switching amplification stages that each comprise pull-up and pull-down devices connected in series between a power line and a ground line and that each drive a switching amplification bias current at a connection terminal for the pull-up device and the pull-down device; and
only the first switching amplification stage or both the first and second switching amplification stages drive the switching amplification bias current in response to the operation mode control signal.

11. The envelope tracking power amplifier of claim 10, wherein the switching amplifier of the multi-mode bias modulator further comprises third and fourth switches that operate to drive the pull-up and pull-down devices of the first switching amplification stage or the pull-up and pull-down devices of the first and second switching amplification stages in response to the operation mode control signal.

12. The envelope tracking power amplifier of claim 1, further comprising:
an operation mode determination unit configured to detect a level of the envelope-modulated bias voltage output by the multi-mode bias modulator, determine any one of the low-level mode and the high-level mode based on a result of comparison between the detected level of the envelope-modulated bias voltage and a specific mode determination reference voltage, and generate the operation mode control signal.

13. The envelope tracking power amplifier of claim 12, wherein the operation mode determination unit detects a level of the envelope-modulated bias voltage output by the multi-mode bias modulator, determines any one of the low-level mode and the high-level mode based on a result of comparison between the detected level of the envelope-modulated bias voltage and a specific mode determination reference hysteresis range, and generates the operation mode control signal.

* * * * *